(12) United States Patent
Shabi et al.

(10) Patent No.: US 11,748,307 B2
(45) Date of Patent: Sep. 5, 2023

(54) SELECTIVE DATA COMPRESSION BASED ON DATA SIMILARITY

(71) Applicant: EMC IP Holding Company LLC, Hopkinton, MA (US)

(72) Inventors: Uri Shabi, Tel Mond (IL); Alexei Kabishcer, Ramat Gan (IL); Jonathan Volij, Meitar (IL)

(73) Assignee: EMC IP Holding Company LLC, Hopkinton, MA (US)

( * ) Notice: Subject to any disclaimer, the term of this patent is extended or adjusted under 35 U.S.C. 154(b) by 85 days.

(21) Appl. No.: 17/500,246

(22) Filed: Oct. 13, 2021

(65) Prior Publication Data
US 2023/0113436 A1    Apr. 13, 2023

(51) Int. Cl.
*G06F 16/00* (2019.01)
*G06F 16/174* (2019.01)
*H03M 7/30* (2006.01)
*G06F 16/13* (2019.01)

(52) U.S. Cl.
CPC ........ *G06F 16/1744* (2019.01); *G06F 16/137* (2019.01); *H03M 7/3064* (2013.01)

(58) Field of Classification Search
CPC . G06F 16/1744; G06F 16/137; H03M 7/3064
See application file for complete search history.

(56) References Cited

U.S. PATENT DOCUMENTS

| 2017/0038978 | A1* | 2/2017 | Li .......................... G06F 3/0611 |
| 2017/0083581 | A1 | 3/2017 | Kozlovsky et al. |
| 2017/0147648 | A1 | 5/2017 | Aronovich |
| 2017/0147649 | A1 | 5/2017 | Aronovich |
| 2017/0286233 | A1 | 10/2017 | Dain et al. |
| 2018/0088855 | A1 | 3/2018 | Akirav et al. |
| 2018/0232419 | A1 | 8/2018 | Aronovich |
| 2019/0294589 | A1 | 9/2019 | Moiseev et al. |
| 2019/0310788 | A1 | 10/2019 | Zhang et al. |
| 2021/0056085 | A1 | 2/2021 | Akerib et al. |
| 2022/0342574 | A1* | 10/2022 | Shabi .................... G06F 3/0641 |

OTHER PUBLICATIONS

"On the resemblance and containment of documents"—Andrei Z. Broder. Published in: Proceedings. Compression and Complexity of Sequences 1997 (Cat. No.97TB100171. Date of Conference: Jun. 13-13, 1997. Date Added to IEEE Xplore: Aug. 6, 2002 Print ISBN:0-8186-8132-2 Inspec Accession No. 6004906 DOI: 10.1109/SEQUEN.1997.666900. Publisher: IEEE. Conference Location: Salerno, Italy.

* cited by examiner

*Primary Examiner* — Tyler J Torgrimson
(74) *Attorney, Agent, or Firm* — BainwoodHuang

(57) ABSTRACT

Technology is disclosed for selectively compressing data based on similarity of pages within the data that is to be compressed. At least one corresponding hash value is generated for each one of multiple candidate pages to be compressed. In response to the hash values generated for the candidate pages, the technology selects a set of similar candidate pages from the candidate pages. The set of similar candidate pages are a subset of the candidate pages that includes less than all the candidate pages. The set of similar candidate pages are compressed as a single unit, separately from one or more other ones of the candidate pages that were not selected to be included in the set of similar candidate pages.

13 Claims, 8 Drawing Sheets

---

800 GENERATE AT LEAST ONE CORRESPONDING HASH VALUE FOR EACH ONE OF MULTIPLE CANDIDATE PAGES TO BE COMPRESSED

↓

802 SELECT, FROM THE CANDIDATE PAGES AND RESPONSIVE TO THE HASH VALUES GENERATED FOR THE CANDIDATE PAGES, A SET OF SIMILAR CANDIDATE PAGES, WHERE THE SET OF SIMILAR CANDIDATE PAGES IS A SUBSET OF THE CANDIDATE PAGES THAT INCLUDES LESS THAN ALL THE CANDIDATE PAGES

↓

804 COMPRESS THE SET OF SIMILAR CANDIDATE PAGES AS A SINGLE UNIT, SEPARATELY FROM ONE OR MORE OTHER ONES OF THE CANDIDATE PAGES THAT WERE NOT SELECTED TO BE INCLUDED IN THE SET OF SIMILAR CANDIDATE PAGES

SELECTIVE DATA COMPRESSION BASED ON DATA SIMILARITY

TECHNICAL FIELD

The present disclosure relates generally to data storage systems, and more specifically to technology for selectively compressing data based on similarity of pages within the data to be compressed.

BACKGROUND

Data storage systems are arrangements of hardware and software that include one or more storage processors coupled to non-volatile data storage drives, such as solid state drives and/or magnetic disk drives. Each storage processor may service host I/O requests received from physical and/or virtual host machines ("hosts"). The host I/O requests received by the storage processor may specify one or more storage objects (e.g. logical units ("LUNs"), and/or files, etc.) that are hosted by the storage system and identify user data that is written and/or read by the hosts. Each storage processor executes software that processes host I/O requests and performs various data processing tasks to organize and persistently store the user data in the non-volatile data storage drives of the data storage system.

Data storage systems may use data compression to efficiently utilize their non-volatile data storage resources. For example, lossless data compression technology may be used to reduce the size of a set of user data by identifying and eliminating redundancy within the data. No information is lost during lossless data compression. Examples of lossless data compression technologies include Lempel-Ziv (LZ) compression methods, such as LZ77, LZ78, DEFLATE, gzip, zstandard, Lempel-Ziv-Welch (LZW), etc. LZ and similar data compression technologies are dictionary-based, generating a dictionary of repeated character sequences found in the data, and then substituting dictionary entry identifiers ("codes") for instances of the character sequences contained in the dictionary that are found in the data. For a given set of data, a compression dictionary may be generated dynamically based on the input data, and then stored in association with the resultant compressed data for later use during decompression.

Data compression ratio ("compression ratio") is a measurement of the relative reduction in size of data resulting from data compression. Compression ratio may, for example, be expressed as the division of uncompressed data size by compressed data size, such that higher compression ratios represent higher levels of data reduction.

SUMMARY

In general, the larger the amount of input data that is compressed together, the higher the probability of repeated character sequences within the input data, and the higher the compression ratio that can be attained. Accordingly, previous data storage technologies have been designed to compress as much data as possible as a single unit. A significant shortcoming of such an approach can be that the data storage system experiences increased overhead in its subsequent processing of host I/O read operations directed to the previously compressed data. For example, in a case where eight 4 KB pages are compressed together, each time the data storage system has to access any one or more of those eight 4 KB pages it must read and perform decompression on the whole set of compressed data (e.g. on 32 KB of compressed data or less, depending on the compression ratio obtained). Such a requirement of reading a larger amount of data than is requested by a read operation may negatively impact data storage system performance during read operation processing, introduce higher read bandwidth to the non-volatile data storage, and require higher processor and/or other resource utilization to perform decompression on relatively larger amounts of data.

To address the above described and other shortcomings of previous technologies, new technology is disclosed herein for selectively compressing data based on similarity of pages of data that are to be compressed. In the disclosed technology, at least one corresponding hash value is generated for each one of multiple candidate pages that are to be compressed. Responsive to the hash values generated for the candidate pages, a set of similar candidate pages is selected from the candidate pages. The set of similar candidate pages is a subset of the candidate pages that includes less than all the candidate pages. The set of similar candidate pages is compressed as a single unit, separately and independently with regard to one or more other ones of the candidate pages that were not selected to be included in the set of similar candidate pages.

In some embodiments, the at least one corresponding hash value generated for each one of the candidate pages may be generated at least in part by generating a single hash value for each one of the candidate pages. In such embodiments, selection of the set of similar candidate pages from the candidate pages may include or consist of comparing the corresponding hash values of the candidate pages, identifying a set of candidate pages having matching corresponding hash values, and selecting the set of candidate pages having matching corresponding hash values as the set of similar candidate pages.

In some embodiments, generation of the at least one corresponding hash value for each one of the candidate pages may include or consist of generating a corresponding set of multiple hash values for each one of the candidate pages. In such embodiments, selection of the set of similar candidate pages from the candidate pages may include or consist of comparing the sets of hash values corresponding to the candidate pages, identifying a set of candidate pages with corresponding sets of hash values having at least a minimum threshold level of similarity to each other, and selecting the set of candidate pages with corresponding sets of hash values having at least the minimum threshold level of similarity to each other as the set of similar candidate pages.

In some embodiments, comparing the corresponding sets of hash values of the candidate pages may include or consist of generating, for each pair of candidate pages, a similarity index using the sets of hash values corresponding to that pair of candidate pages. In such embodiments, the minimum level of similarity may be a minimum similarity index value, and identifying the set of candidate pages with corresponding sets of hash values having at least the minimum threshold level of similarity to each other may include or consist of identifying a set of candidate pages within which each candidate page has a corresponding set of hash values with at least the minimum similarity index value with respect to the corresponding set of hash values of each other candidate page.

In some embodiments, generating the similarity index for each pair of candidate pages may include or consist of generating, for each pair of candidate pages, a Jaccard similarity index using the corresponding sets of hash values for the pair.

In some embodiments, generating the corresponding set of hash values for each one of the candidate pages may include or consist of selecting a corresponding hash value for each one of multiple data element positions across multiple data subsets located within the candidate page.

In some embodiments, selecting the corresponding hash value for each one of the multiple data element positions across the multiple data subsets within the candidate page may include or consist of selecting a maximum corresponding hash value for each one of the multiple data element positions across the multiple data subsets.

In some embodiments, the disclosed technology may operate by selecting, as the set of hash values corresponding to each candidate page, fewer than the total number of corresponding hash values selected for the data element positions across the plurality of data subsets within the candidate page.

In some embodiments, compressing the set of similar candidate pages as a single unit separately from the one or more other ones of the candidate pages that were not selected to be included in the set of similar candidate pages may further include generating a compression dictionary for the set of similar candidate pages that is separate and independent from one or more compression dictionaries generated for the other ones of the candidate pages that were not selected to be included in the set of similar candidate pages.

Embodiments of the disclosed technology may provide significant advantages over previous technology. For example, by identifying and separately compressing sets of similar data pages, the disclosed technology enables a data storage system to avoid operating such that large amounts of dissimilar data is compressed together. The disclosed technology may improve overall compression ratios because compressing sets of similar data pages results in higher compression ratios than compression of sets of dissimilar data pages. The disclosed technology avoids combining dissimilar pages for compression, since compressing combinations of dissimilar pages may result in higher read overhead without any significant improvement in compression ratio resulting from compressing similar data pages. By grouping together similar data pages for separate compression, the disclosed technology may reduce the occasions in which large amounts of dissimilar data are compressed together, which would result in high overhead when performing the subsequent processing of host I/O read operations that are directed to previously compressed data, without providing an improvement in the compression ratio.

BRIEF DESCRIPTION OF THE DRAWINGS

The objects, features and advantages of the disclosed technology will be apparent from the following description of embodiments, as illustrated in the accompanying drawings in which like reference numbers refer to the same parts throughout the different views. The drawings are not necessarily to scale, emphasis instead being placed on illustrating the principles of the disclosed technology.

DETAILED DESCRIPTION

Figure 1:
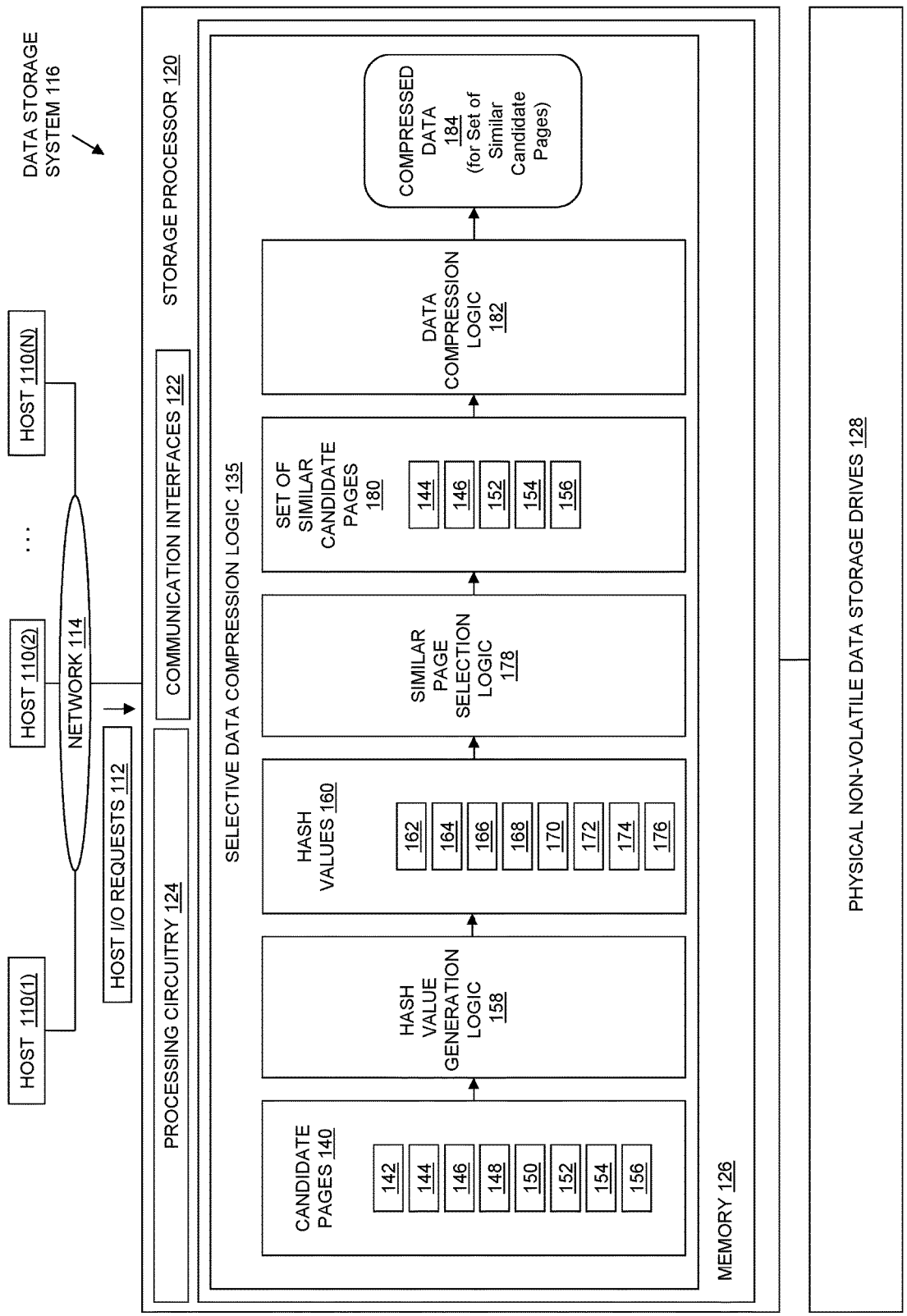
FIG. 1 is a block diagram showing an example of a data storage system in which an embodiment of the disclosed technology is embodied.

Embodiments of the invention will now be described with reference to the figures. The embodiments described herein are provided only as examples, in order to illustrate various features and principles of the disclosed technology, and the invention is broader than the specific embodiments described herein.

Embodiments of the disclosed technology provide improvements over previous technologies by selectively compressing data based on similarity of pages of data within a set of candidate pages that are to be compressed. At least one corresponding hash value is generated for each candidate page, and a set of similar pages is selected from the candidate pages based on the hash values, e.g. a subset of the candidate pages that contains less than all the candidate pages. The set of similar candidate pages is compressed as a single unit, separately and independently from one or more other candidate pages that were not selected to be included in the set of similar candidate pages. The corresponding hash value generated for each one of the candidate pages may be a single hash value, and the set of similar candidate pages may be selected from the candidate pages by comparing the corresponding hash values of the candidate pages, identifying a set of candidate pages having matching corresponding hash values, and selecting a set of candidate pages having matching corresponding hash values as the set of similar candidate pages. The corresponding hash value for each candidate page may alternatively be a set of multiple hash values, and the set of similar candidate pages may be selected from the candidate pages by comparing the sets of hash values corresponding to the candidate pages, identifying a set of candidate pages with corresponding sets of hash values having at least a minimum threshold level of similarity to each other, and selecting the set of candidate pages with corresponding sets of hash values having at least the minimum threshold level of similarity to each other as the set of similar candidate pages. Sets of hash values may be compared by generating, for each pair of candidate pages, a similarity index based on the corresponding sets of hash values. The required minimum level of similarity may be a minimum similarity index value, such as a Jaccard similarity index.

The corresponding set of hash values for each candidate page may include a corresponding hash value selected for each one of multiple intra-subset data element positions across multiple data subsets located within the candidate page. The corresponding hash value for each data element position may include or consist of a maximum corresponding hash value for each one of the multiple data element positions determined across all the data subsets in the candidate page. The set of hash values corresponding to each candidate page may contain fewer than the total number of data element positions. The set of similar candidate pages may be compressed as a single unit separately from the other ones of the candidate pages in part by generating a compression dictionary for the set of similar candidate pages that is separate and independent from one or more compression dictionaries generated for other ones of the candidate pages that were not selected for the set of similar candidate pages.

FIG. 1 is a block diagram showing an operational environment for the disclosed technology, including an example of a data storage system in which the disclosed technology is embodied. FIG. 1 shows a number of physical and/or virtual Host Computing Devices 110, referred to as "hosts", and shown for purposes of illustration by Hosts 110(1) through 110(N). The hosts and/or applications executing thereon may access data storage provided by Data Storage System 116, for example over one or more physical or virtual networks, such as a local area network (LAN), and/or a wide area network (WAN) such as the Internet, etc., and shown for purposes of illustration in FIG. 1 by Network 114. Alternatively, or in addition, one or more of Hosts 110(1) and/or applications accessing data storage provided by Data Storage System 116 may execute within Data Storage System 116. Data Storage System 116 includes at least one Storage Processor 120 that is communicably coupled to both Network 114 and Physical Non-Volatile Data Storage Drives 128, e.g. at least in part though one or more of the Communication Interfaces 122. No particular hardware configuration is required, and Storage Processor 120 may be embodied as any specific type of device that is capable of processing host input/output (I/O) requests (e.g. I/O read and I/O write requests, etc.) and persistently storing user data.

The Physical Non-Volatile Data Storage Drives 128 may include physical data storage drives such as solid state drives, magnetic disk drives, hybrid drives, optical drives, and/or other specific types of drives.

A Memory 126 in Storage Processor 120 stores program code that is executable on Processing Circuitry 124, as well as data generated and/or processed by such program code. Memory 126 may include volatile memory (e.g. RAM), and/or other types of memory. The Processing Circuitry 124 may, for example, include or consist of one or more microprocessors, e.g. central processing units (CPUs), multi-core processors, chips, and/or assemblies, and associated circuitry.

Processing Circuitry 124 and Memory 126 together form control circuitry that is configured and arranged to carry out various methods and functions described herein. The Memory 126 stores a variety of software components that may be provided in the form of executable program code. For example, Memory 126 may include software components such as Selective Data Compression Logic 135. When program code stored in Memory 126 is executed by Processing Circuitry 124, Processing Circuitry 124 is caused to carry out the operations of the software components. Although certain software components are shown in the Figures and described herein for purposes of illustration and explanation, those skilled in the art will recognize that Memory 126 may include various other types of software components, such as operating system components, various applications, hosts, other specific processes, etc.

During operation, Selective Data Compression Logic 135 compresses user data based on similarity of pages of data that are to be compressed. The data that is compressed may include user data indicated by write I/O requests in Host I/O Requests 112. An example of user data that is received by Selective Data Compression Logic 135 for compression by Selective Data Compression Logic 135 is shown by Candidate Pages 140. For purposes of explanation Candidate Pages 140 is shown including eight pages, e.g. candidate pages 142, 144, 146, 148, 150, 152, 154, and 156. The pages in Candidate Pages 140 may consist of or include pages of user data that has been received by Storage Processor 120 from Hosts 110 but not previously compressed or stored into Physical Non-Volatile Data Storage Drives 128. Alternatively, the pages in Candidate Pages 140 may consist of or include pages of user data that has previously been received from Hosts 110 and stored into Physical Non-Volatile Data Storage Drives 128 without being compressed. In another example, the pages in Candidate Pages 140 may consist of or include pages of user data that has previously been received and compressed and stored into Physical Non-Volatile Data Storage Drives 128, e.g. at a lower compression ratio than may be obtained through compression using Selective Data Compression Logic 135.

The pages in Candidate Pages 140 may each have the same size, e.g. 4096 bytes or some other specific size.

Candidate Pages 140 are passed to Hash Value Generation Logic 158. Hash Value Generation Logic 158 applies a similarity hash function to each page in Candidate Pages 140 to generate at least one corresponding hash value for each one of the pages in Candidate Pages 140. The hash function applied by Hash Value Generation Logic 158 may be part of a locality-sensitive hashing (LSH) scheme used by Selective Data Compression Logic 135 to identify sets of similar candidate pages. In some embodiments, the application of the similarity hash function to the Candidate Pages 140 produces similar, or even the same, hash values for similar candidate pages. In some embodiments, an individual hash value may be generated for each page in Candidate Pages 140, e.g. from a representative portion of the data in each page.

In other embodiments, application of the similarity hash function to the Candidate Pages 140 may produce a set of multiple hash values for each one of the Candidate Pages 140. Such sets of multiple hash values may be compared to determine similar candidate pages. In some embodiments, the set of multiple hash values generated for each page in Candidate Pages 140 may include hash values that are generated with regard to data located at multiple respective data positions across multiple subsets of the page.

For purposes of illustration, the one or more hash values generated by Hash Value Generation Logic 158 for each one of the pages in Candidate Pages 140 are shown by Hash Values 160. The one or more hash values generated for candidate page 142 are shown by hash values 162, the one or more hash values generated for candidate page 144 are shown by hash values 164, the one or more hash values generated for candidate page 146 are shown by hash values 166, the one or more hash values generated for candidate page 148 are shown by hash values 168, the one or more hash values generated for candidate page 150 are shown by hash values 170, the one or more hash values generated for candidate page 152 are shown by hash values 172, the one or more hash values generated for candidate page 154 are shown by hash values 174, and the one or more hash values generated for candidate page 156 are shown by hash values 176.

Hash Values 160 are passed to Similar Page Selection Logic 178. Similar Page Selection Logic 178 operates in response to the Hash Values 160 by selecting the Set of Similar Candidate Pages 180 from Candidate Pages 140 based on the Hash Values 160. For example, Similar Page Selection Logic 178 may compare the corresponding hash values (either individual hash values or sets of hash values) of each pair of candidate pages in Candidate Pages 140, and in this way determines which ones of the candidate pages are sufficiently similar to each other, based on their corresponding hash values. Those ones of the candidate pages that are determined by Similar Page Selection Logic 178 to be sufficiently similar based on their corresponding hash values are included by Similar Page Selection Logic 178 in the Set of Similar Candidate Pages 180. In the example of FIG. 1, candidate pages 144, 146, 152, 154, and 156 are determined by Similar Page Selection Logic 178 to be sufficiently similar to each other, and are therefore included by Similar Page Selection Logic 178 in the Set of Similar Candidate Pages 180.

As shown in FIG. 1, the Set of Similar Candidate Pages 180 generated by Similar Page Selection Logic 178 from Candidate Pages 140 based on Hash Values 160 may contain less than all the pages in Candidate Pages 140. For example, pages 142, 148, and 150 were not selected for inclusion in Set of Similar Candidate Pages 180, since they were not determined to be sufficiently similar to pages 144, 146, 152, 154 and 156.

The Set of Similar Candidate Pages 180 is passed to Data Compression Logic 182. Data Compression Logic 182 compresses all the pages in the Set of Similar Candidate Pages 180 as a single unit of data, using a lossless data compression algorithm that is applied across the combined pages in Set of Similar Candidate Pages 180. The compression performed on the Set of Similar Candidate Pages 180 is separate and independent with regard to any compression performed on one or more other pages in Candidate Pages 140 that were not selected to be included in the Set of Similar Candidate Pages 180 (e.g. compression of pages 144, 146, 152, 154 and 156 is performed separately and independently from the compression of pages 142, 148, and 150). The resulting Compressed Data 184 that Data Compression Logic 182 generates by compressing the combined pages contained in Set of Similar Candidate Pages 180 may then be stored into Physical Non-Volatile Data Storage Drives 128. Any other compressed data resulting from the separate and independent compression of pages 142, 148, and/or 150 may subsequently be separately stored into Physical Non-Volatile Data Storage Drives 128.

As described above, in some embodiments, Hash Value Generation Logic 158 may generate a single hash value for each one of the pages in Candidate Pages 140. In such embodiments, Similar Page Selection Logic 178 may select the pages in the Set of Similar Candidate Pages from the Candidate Pages 140 by comparing the corresponding individual corresponding hash values for each pair of pages in Candidate Pages 140, identifying a set of candidate pages having matching corresponding hash values, and selecting as the Set of Similar Candidate Pages 180 the set of candidate pages having matching corresponding hash values. The set of candidate pages having matching corresponding hash values may be selected such that they have exactly matching corresponding hash values, or alternatively may be selected such that they have sufficiently similar corresponding individual hash values, e.g. based on Hamming distance between hash values or the like.

As also described above, in some embodiments, Hash Value Generation Logic 158 may generate a corresponding set of multiple hash values for each one of the candidate pages. In such embodiments, Similar Page Selection Logic 178 may select the pages in the Set of Similar Candidate Pages from the Candidate Pages 140 by comparing the corresponding sets of hash values for each pair of pages in Candidate Pages 140, identifying a set of candidate pages with corresponding sets of hash values having at least a minimum threshold level of similarity to each other, and selecting as the Set of Similar Candidate Pages 180 a set of candidate pages in Candidate Pages 140 that all have corresponding sets of hash values with at least the minimum threshold level of similarity to each other.

In some embodiments, Similar Page Selection Logic 178 may compare corresponding sets of hash values of pairs of candidate pages by generating, for the corresponding sets of hash values of each pair of candidate pages, a similarity index. For example, such a similarity index may be a value between 0 and 1, with lower values indicating less similarity (e.g. 0 indicating complete dissimilarity), and higher values indicating greater similarity (e.g. 1 indicating complete similarity). In such embodiments, the minimum required level of similarity may be a predetermined or dynamically determined minimum required similarity index value, e.g. 0.75, 0.80, 0.90, etc. For example, a minimum required similarity index value for corresponding sets of hash values that is necessary for a pair of pages to be considered similar might be dynamically determined by Selective Data Compression Logic 135 based on current received workload and/or resource utilization within Storage Processor 120, and/or based on other factors. For example, the minimum required similarity index value may be calculated based on a current utilization of Physical Non-Volatile Data Storage Drives 128, such that higher utilization of Physical Non-Volatile Data Storage Drives 128 results in a lower minimum required similarity index value. Similar Page Selection Logic 178 may, for example, operate by identifying a set of candidate pages with corresponding sets of hash values having at least the minimum threshold level of similarity to each other (e.g. Set of Similar Candidate Pages 180) by identifying a set of candidate pages within Candidate Pages 140 in which each candidate page has a corresponding set of hash values that, when compared to the corresponding set of hash values of each other candidate page in the set, has at least the minimum required similarity index value.

In some embodiments, Similar Page Selection Logic 178 may generate the similarity index for each pair of candidate pages in Candidate Pages 140 by generating, for each pair of candidate pages, a Jaccard similarity index for the corresponding sets of hash values. In the case of two sets of hash values, the Jaccard index may be the number of values that are contained in both sets (the intersection of the sets), divided by the total number of values contained in the combined sets, with values contained in both sets being counted only once (the union of the sets). For example, for two sets of hash values set 1 and set 2, the Jaccard index may be calculated as follows:

$$J(\text{set 1}, \text{set 2}) = |\text{the intersection of sets 1 and 2}|/|\text{the union of sets 1 and 2}|$$

or:

$$J(\text{set 1}, \text{set 2}) = |1 \cap 2|/|1 \cup 2|$$

In some embodiments, Hash Value Generation Logic 158 may generate the corresponding set of hash values for each one of the candidate pages by at least in part by selecting a corresponding hash value for each one of multiple intra-data subset data element positions, across multiple data subsets within the candidate page. See also FIGS. 4-7 and associated text below.

In some embodiments, Hash Value Generation Logic 158 may select the corresponding hash value for each one of the multiple data element positions across the multiple data subsets within the candidate page may include or consist of selecting a maximum corresponding hash value for chunks of data located at each one of the multiple data element positions across the multiple data subsets. See also FIGS. 4-7 and associated text below.

In some embodiments, Hash Value Generation Logic 158 may operate by selecting, as the set of hash values corresponding to each candidate page, fewer than the total number of corresponding hash values selected for the data element positions across the plurality of data subsets within the candidate page. For example, each set of hash values contains M hash values, while the total number of intra-data subset data element positions is K, and M<K. See also FIGS. 4-7 and associated text below.

In some embodiments, Data Compression Logic 182 may compress Set of Similar Candidate Pages 180 as a single unit, separately from the one or more other ones of the candidate pages that were not selected to be included in the set of similar candidate pages, at least in part by also generating and storing (e.g. in Physical Non-Volatile Data Storage Drives 126 in association with or as part of Compressed Data 184) a single compression dictionary for the combined candidate pages in Set of Similar Candidate Pages 180 that is separate and independent from one or more compression dictionaries generated for the other ones of the candidate pages that were not selected to be included in Set of Similar Candidate Pages 180. The dictionary generated for the combined candidate pages in Set of Similar Candidate Pages 180 may, for example, consist of or include a dictionary of repeated character sequences found in the candidate pages in Set of Candidate Pages 180 by Data Compression Logic 182, and indicate dictionary entry identifiers ("codes") that were substituted for instances of those character sequences when the candidate pages in Set of Candidate Pages 180 were compressed as a single unit by Data Compression Logic 182. The dictionary generated for the combined candidate pages in Set of Candidate Pages 180 is subsequently used to decompress Compressed Data 184.

In some embodiments, the Set of Similar Candidate Pages 180 selected from Candidate Pages 140, based on the Hash Values 160, may be one of one or more sets of similar candidate pages, each having the same size (i.e. having a "common size") that is determined based on the Hash Values 160. The common size of the one or more sets of similar candidate pages may be determined by Selective Data Compression Logic 135 dividing Candidate Pages 140 into progressively larger subsets of candidate pages, generating similarity indices for pairs of subsets at each one of the progressively larger subset sizes, and determining which size of subset results in higher similarity indices. The common size for one or more sets of similar candidate pages may then be calculated to be a subset size resulting in relatively higher or the highest similarity indices, multiplied by two. For example, for a set of candidate pages P0 through P7, for subsets having a size of one 4 KB candidate page each, the Selective Data Compression Logic 135 (e.g. Similar Page Selection Logic 178) may calculate a Jaccard index between pairs of subsets as follows:

$J(P0,P1), J(P2,P3), J(P4,P5), J(P6,P7)$

Progressing then to a next larger subset size, e.g. where each subset is a combination of two candidate pages, and thus each subset is 8 KB in size, Selective Data Compression Logic 135 (e.g. Similar Page Selection Logic 178) may calculate a Jaccard index between the resulting pairs of subsets as follows:

$J(P0+P1,P2+P3), J(P4+P5,P6+P7)$

And again progressing then to a next larger subset size, e.g. where each subset is a combination of four candidate pages, and thus each subset is 16 KB in size, Selective Data Compression Logic 135 (e.g. Similar Page Selection Logic 178) may calculate a Jaccard index between the resulting pair of subsets as follows:

$J(P0+P1+P2+P3,P4+P5+P6+P7)$

Similar Page Selection Logic 178 may then compare the Jaccard index values that were calculated at the different subset sizes in order to determine the common size for one or more sets of similar candidate pages. For example, in the case where subsets of one 4K page each resulted in Jaccard index values indicating high dissimilarity (values of J close to 0), while subsets of two and four pages each (e.g. 8 KB and 16 KB) resulted in Jaccard index values indicating high similarity (values of J close to 1), the disclosed technology may determine a common size for one or more sets of similar candidate pages that is either i) twice two pages, i.e. four pages (e.g. 16 KB), resulting in pages P0, P1, P2, and P3 being selected for a first set of similar candidate pages and being compressed together, and in pages P4, P5, P6, and P7 being selected for a second set of similar candidate pages and being compressed together, or ii) twice four pages, i.e. eight pages (e.g. 32 KB), resulting in pages P0, P1, P2, P3, P4, P5, P6, and P7 being selected for a single set of similar candidate pages and being compressed together.

Figure 2:
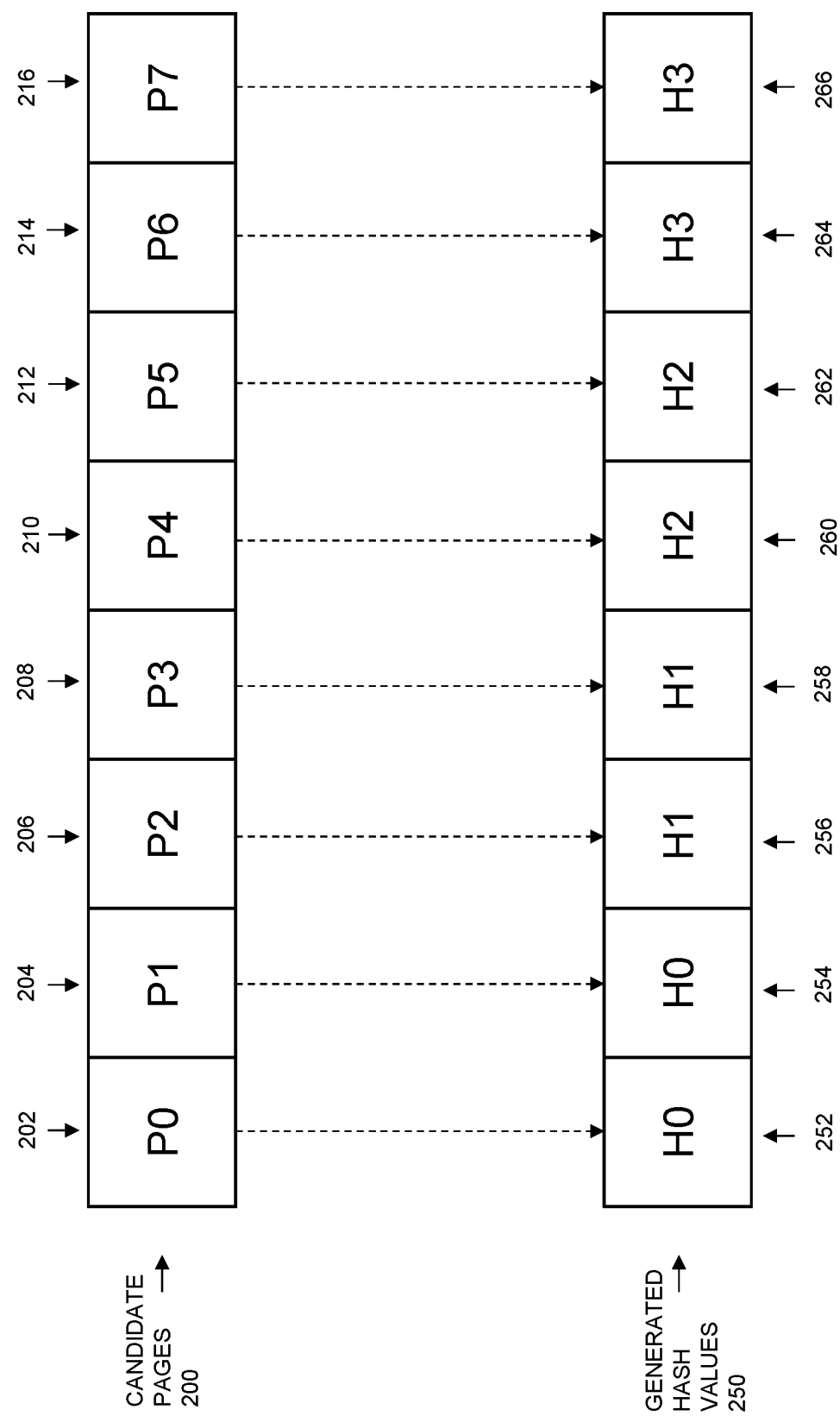
FIG. 2 is a block diagram showing a first example of candidate pages and corresponding hash values generated by the disclosed technology.

FIG. 2 is a block diagram showing a first example of candidate pages and corresponding hash values generated by the disclosed technology. In the example of FIG. 2, Candidate Pages 200 are received by the selective data compression logic, e.g. including pages 202, 204, 206, 208, 210, 212, 214, and 216. The hash value generation logic generates Generated Hash Values 250 from Candidate Pages 200. Generated Hash Values 250 includes one or more hash values corresponding to each one of the pages in Candidate Pages 200. For example, hash value 252 corresponds to page 202, hash value 254 corresponds to page 204, hash value 256 corresponds to page 206, hash value 258 corresponds to hash value 208, hash value 260 corresponds to page 210, hash value 262 corresponds to page 212, hash value 264 corresponds to page 214, and hash value 266 corresponds to page 216.

In the example of FIG. 2, the similar page selection logic determines that hash values 252 and 254 are both the same value, e.g. both have a value of H0. Hash values 252 and 254 are therefore determined to match. Accordingly, based on the fact that hash values 252 and 254 match, the corresponding pages 202 and 204 (e.g. pages P0 and P1) are determined to be similar candidate pages. The similar page selection logic therefore generates a set of similar candidate pages that includes pages 202 and 204 (e.g. pages P0 and P1). The data compression logic then compresses the set of similar candidate pages that includes pages 202 and 204 (e.g. pages P0 and P1) as a single unit of data, separately and independently from compression performed on the other pages in Candidate Pages 200.

Also in the example of FIG. 2, the similar page selection logic determines that hash values 256 and 258 are both the same value, e.g. both have a value of H1. Hash values 256 and 258 are therefore determined to match. Accordingly, based on the fact that hash values 256 and 258 match, the corresponding pages 206 and 208 (e.g. pages P2 and P3) are determined to be similar candidate pages. The similar page selection logic therefore generates a set of similar candidate pages that includes pages 206 and 208 (e.g. pages P2 and P3). The data compression logic then compresses the set of similar candidate pages that includes pages 206 and 208 (e.g. pages P2 and P3) as a single unit of data, separately and independently from compression performed on the other pages in Candidate Pages 200.

Also in the example of FIG. 2, the similar page selection logic determines that hash values 260 and 262 are both the same value, e.g. both have a value of H2. Hash values 260 and 262 are therefore determined to match. Accordingly, based on the fact that hash values 260 and 262 match, the corresponding pages 210 and 212 (e.g. pages P4 and P5) are determined to be similar candidate pages. The similar page selection logic therefore generates a set of similar candidate pages that includes pages 210 and 212 (e.g. pages P4 and P5). The data compression logic then compresses the set of similar candidate pages that includes pages 210 and 212 (e.g. pages P4 and P5) as a single unit of data, separately and independently from compression performed on the other pages in Candidate Pages 200.

Further in the example of FIG. 2, the similar page selection logic determines that hash values 264 and 266 are both the same value, e.g. both have a value of H3. Hash values 264 and 266 are therefore determined to match. Accordingly, based on the fact that hash values 264 and 266 match, the corresponding pages 214 and 216 (e.g. pages P6 and P7) are determined to be similar candidate pages. The similar page selection logic therefore generates a set of similar candidate pages that includes pages 214 and 216 (e.g. pages P6 and P7). The data compression logic then compresses the set of similar candidate pages that includes pages 214 and 216 (e.g. pages P6 and P7) as a single unit of data, separately and independently from compression performed on the other pages in Candidate Pages 200.

Figure 3:
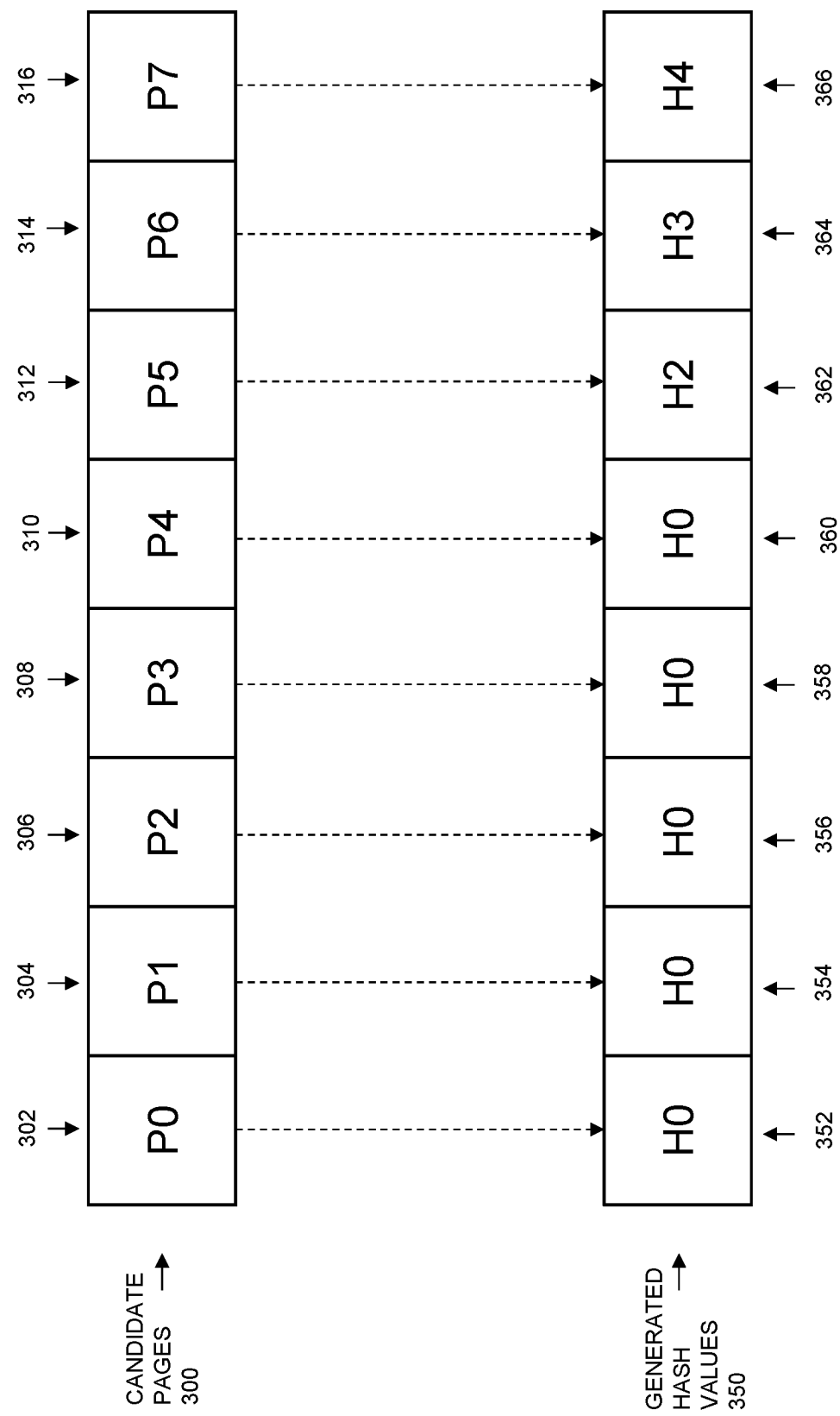
FIG. 3 is a block diagram showing a second example of candidate pages and corresponding hash values generated by the disclosed technology.

FIG. 3 is a block diagram showing a second example of candidate pages and corresponding hash values generated by the disclosed technology. In the example of FIG. 3, Candidate Pages 300 are received by the selective data compression logic, e.g. including pages 302, 304, 306, 308, 310, 312, 314, and 316. The hash value generation logic generates Generated Hash Values 350 from Candidate Pages 300. Generated Hash Values 350 includes one or more hash values corresponding to each one of the pages in Candidate Pages 300. For example, hash value 352 corresponds to page 302, hash value 354 corresponds to page 304, hash value 356 corresponds to page 306, hash value 358 corresponds to hash value 308, hash value 360 corresponds to page 310, hash value 362 corresponds to page 312, hash value 364 corresponds to page 314, and hash value 366 corresponds to page 316.

In the example of FIG. 3, the similar page selection logic determines that hash values 352, 354, 356, 358 and 360 are all the same value, e.g. all have a value of H0. Hash values 352, 354, 356, 358 and 360 are therefore determined to match. Accordingly, based on the fact that hash values 352, 354, 356, 358 and 360 match, the corresponding pages 302, 304, 306, 308 and 310 (e.g. pages P0, P1, P2, P3, and P4) are determined to be similar candidate pages. The similar page selection logic therefore generates a set of similar candidate pages that includes pages 302, 304, 306, 308 and 310 (e.g. pages P0, P1, P2, P3, and P4). The data compression logic then compresses the set of similar candidate pages that includes pages 302, 304, 306, 308 and 310 (e.g. pages P0, P1, P2, P3, and P4) as a single unit of data, separately and independently from compression performed on the other pages in Candidate Pages 300.

While one example of hash value generation that may be used in the disclosed technology is shown in FIGS. 4-7, and described in the corresponding text, those skilled in the art will recognize that the disclosed technology is not limited to embodiments that use the hash value generation approach shown in FIGS. 4-7. Alternatively, the disclosed technology may be embodied using any specific type of locality-sensitive hashing (LSH) technology that is capable of generating multiple hashes for a candidate page to generate hash values (e.g. Hash Values 180 in FIG. 1). For example, such alternative techniques for hash value generation may include or consist of techniques such as bit sampling for hamming distance, min-wise independent permutations techniques ("MinHash"), etc.

Figure 4:
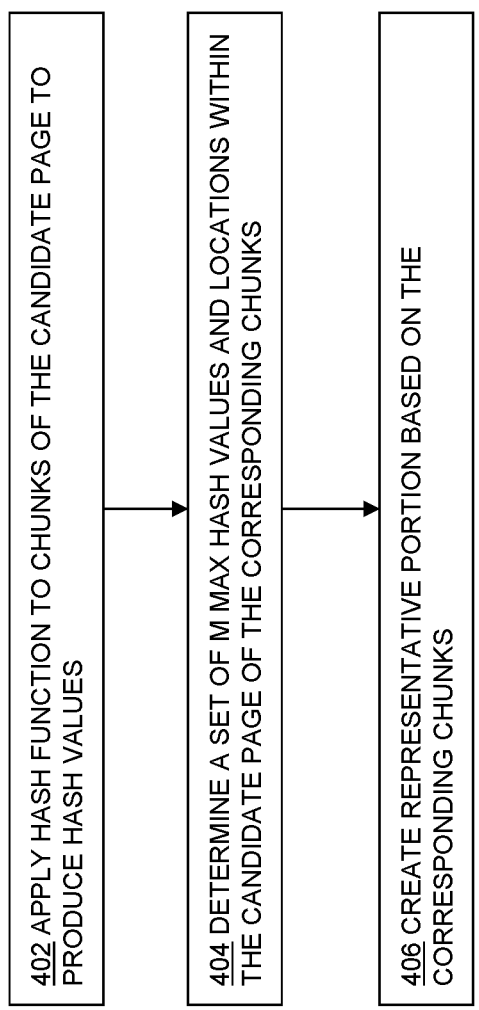
FIG. 4 is a flow chart showing an example of steps performed in some embodiments while creating a representative portion of a candidate page for hashing.

FIG. 4 is a flow chart showing an example of steps that may be performed in some embodiments to create a representative portion of a candidate page for purposes of hashing. Alternatively, a representative portion of a candidate page may be created for hashing using variations of the method shown in FIG. 4, and such alternatives are intended to fall within the scope of the invention. The representative portion of a candidate page created through the steps shown in FIG. 4 may be hashed to generate a single hash value corresponding to the candidate page. In some embodiments, the steps of FIG. 4 may, for example, be performed by the Hash Value Generation Logic 158 shown in FIG. 1 for each one of the candidate pages in Candidate Pages 140.

The representative portion of a candidate page may be made up of multiple chunks of data within the candidate page, where each chunk includes at least one contiguous, uninterrupted section of data within the candidate page. The chunks of data that make up the representative portion are not necessarily contiguous to each other within the candidate page, although it is possible. In some embodiments, it may be unlikely that any two of the chunks of the representative portion are contiguous to one another.

In step 402, a hash function, for example a prime multiplication based hash function or the like, is applied to individual chunks of the candidate page. Other specific types of hash functions may be applied in the alternative. In step 404, a set of M maximum hash values may be determined, and locations within the candidate page of the chunks corresponding to the maximum hash values may be determined and recorded (e.g. stored). Alternatively, a set of M minimum hash values may be determined instead, and locations within the candidate page of the chunks corresponding to the minimum hash values recorded. In some embodiments in which a set of multiple hash values is generated for each candidate page, the set of M max/min hash values determined at step 404 may be used as the set of multiple hash values generated for the corresponding candidate page.

Steps 402 and 404 may, for example, be collectively implemented by the steps shown in FIG. 5, and as further described below in the text referencing FIG. 5.

In step 406, a representative portion of the candidate page may be created based on the chunks corresponding to the set of M of max/min hash values, for example as shown by the steps in FIG. 7 and as further described with reference to FIG. 7 in the text below. In some embodiments in which a single hash value is generated for each candidate page, a hash of the representative portion created at step 406 may be used as the hash value for the corresponding candidate page.

Figure 5:
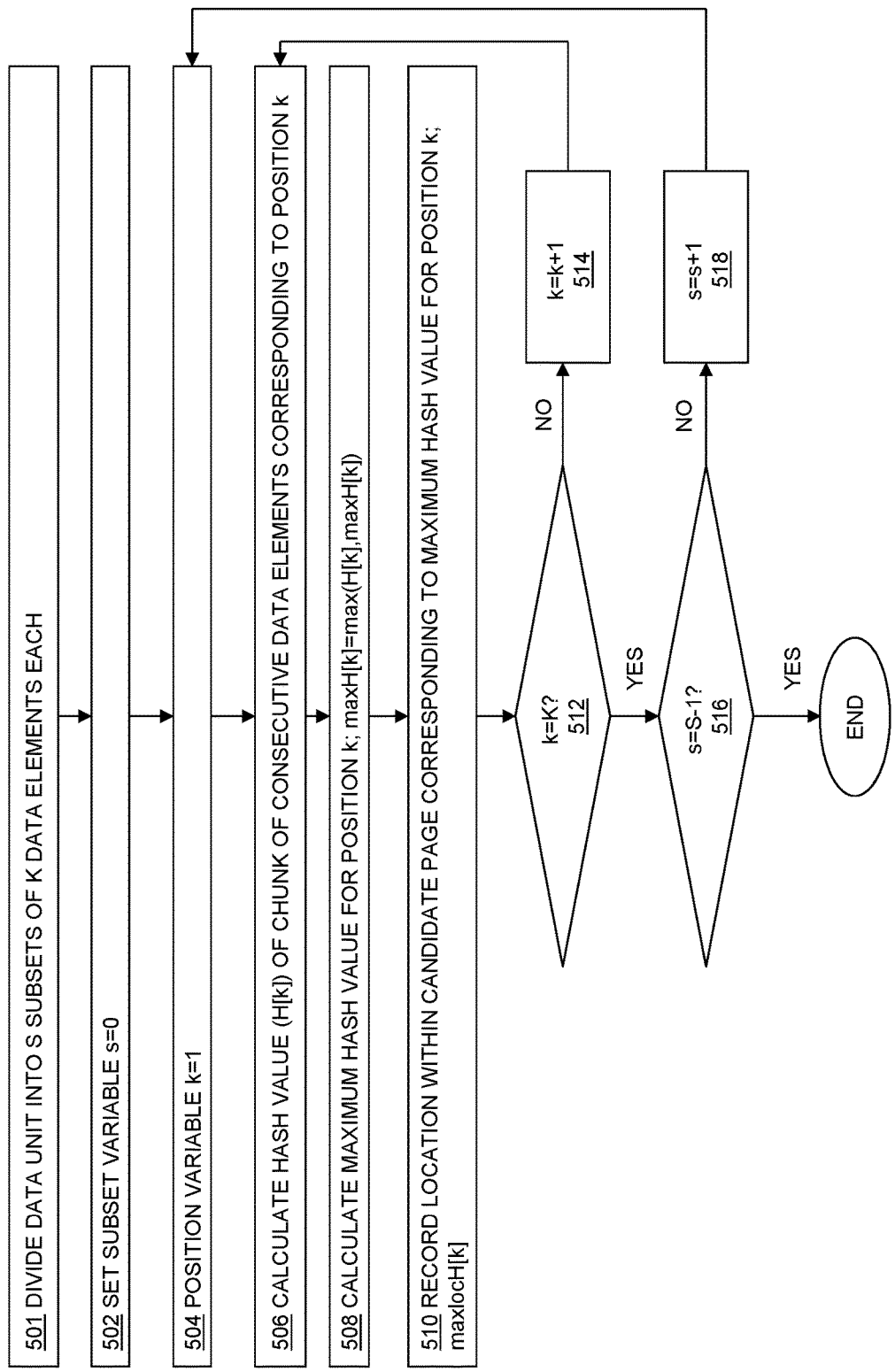
FIG. 5 is a flow chart showing an example of steps performed in some embodiments to apply a hash function to chunks of a candidate page in order to generate a set of multiple hash values for the candidate page.

FIG. 5 shows an example of steps that may be performed in some embodiments to apply a hash function to chunks of a candidate page in order to generate a set of multiple hash values for the candidate page, e.g. to generate a set of maximum or alternatively minimum hash values for chunks of data within the candidate page. Alternatively, variations of the steps shown in FIG. 5 may be used to generate a set of multiple hash values for a candidate page. In some embodiments, the steps of FIG. 5 may, for example, be performed by the Hash Value Generation Logic 158 shown in FIG. 1 for each one of the candidate pages in Candidate Pages 140.

In step 501, the candidate page is divided into S subsets of K data elements each, using data elements such as bytes (e.g. the candidate pages is divided such that each of the S subsets in the candidate page has K bytes). For example, in some embodiments, a 4 KB (4096 bytes) candidate page of data may be divided into 512 (i.e., S=512) subsets of 8 (i.e., K=8) bytes each.

In step 502, a subset variable, e.g. "s", is initialized, e.g. to 0. In step 504, a data element position variable, e.g. "k", is initialized, e.g. to 1.

In step 506, a hash value H[k] is determined for a current chunk of consecutive data elements corresponding to the current position k within the current subset s. This determination is further illustrated in FIG. 6, which will also be referenced throughout the description of the steps of FIG. 5.

Figure 6:
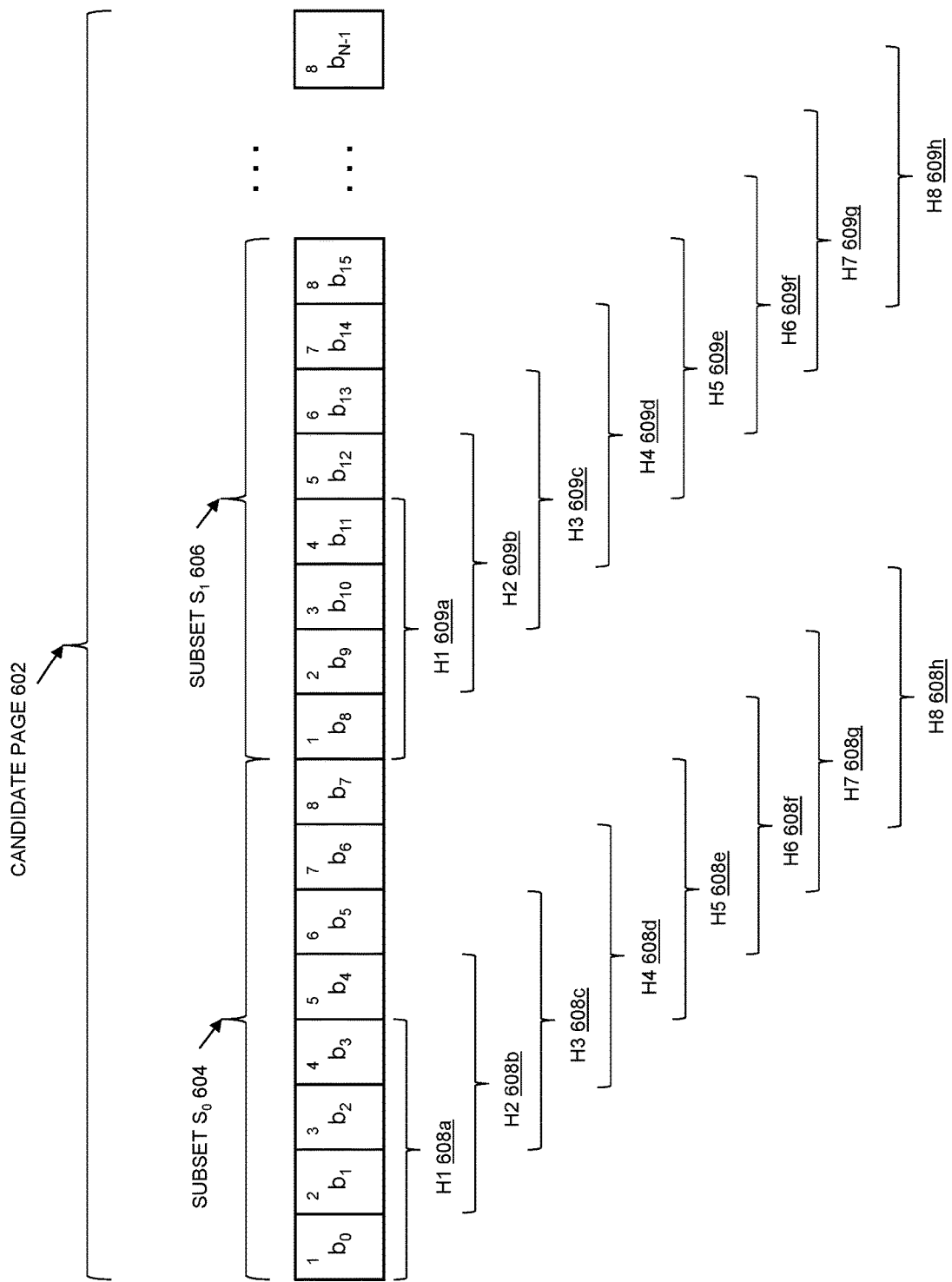
FIG. 6 is a block diagram showing an example of how a hash function may be applied to chunks of a candidate page to generate a set of multiple hash values for the candidate page in some embodiments.

FIG. 6 shows an example of a Candidate Page 602 having a hash function applied to chunks of data within it to determine maximum hash values at intra-subset data element positions across subsets within Candidate Page 602, according to some embodiments. Alternatively, some embodiments may determine minimum hash values for intra-sub set data element positions in the candidate page instead of maximum hash values.

The candidate page 602 includes multiple data elements (e.g. bytes), e.g. data element $b_0$ data element $b_{N-1}$, which are divided into S subsets, including subsets $S_0$ and $S_1$. Each data element also has an intra-subset position k (e.g. from 1 to 8) within its respective subset, which is indicated in FIG. 6 by the number in the upper left corner of each data element. For example, in some embodiments, N=4096, S=512 and K=8.

Step 506 of FIG. 5 may apply a hash function to the chunk of four data elements (e.g. data elements $b_0$-$b_3$) beginning at the current data element (e.g. the data element $b_0$) that is located at the current data element position (e.g. at data element position k=1) within the current subset (e.g. subset $S_0$) in order to calculate a corresponding hash value H[k], e.g. H1 608a in FIG. 6, for that data element position within the current subset. The hash function may, for example, be a simple prime multiplication hash function or some other type of hash function. It should be appreciated that, while in the example of FIG. 6 each chunk is made up of four data elements, the disclosed technology is not so limited, and each chunk may alternatively be made up of some other number of data elements.

In a step 508 of FIG. 5, a maximum one of the hash values generated for position k in any of the subsets thus far processed is determined; i.e., maxH[k]=max(H[k], maxH [k]). For example, for the first subset $S_0$ 604, maxH[k]=H[k], For example, with additional reference to FIG. 6, in a first pass through the steps 506-508 of FIG. 5, for a first data element position within the first subset $S_0$ 604, the disclosed technology may determine that maxH[1]=H1 608a (see FIG. 6). For future passes through the steps 506-508 of FIG. 5 for subsequent subsets within the candidate page, the value of maxH[k] for k=1 may be updated depending on the hash values (e.g. subsequent values of "H1") generated for the chunks beginning at data element position 1 in each of those subsequently processed subsets. For example, in the case where the hash value H1 609a that is generated for the chunk located at data element position 1 (e.g. for k=1) for the subset $S_1$ 606 is greater than the hash value H1 608a that was generated for the chunk located at data element position 1 (e.g. k=1) for the subset $S_0$ 604, then the value of maxH[1] is updated to H1 609a. Alternatively, in embodiments in which minimum hash values are determined for the intra-subset data element positions across the subsets of the candidate page, maxH[1] would be updated to H1 609a if H1 609a were less than the hash value H1 608a.

In step 510, the location within the candidate page corresponding to the maximum hash value generated for position k is recorded. For example, a value maxlocH[k] may be recorded. For example, the location within the candidate page may be specified at least in part by an offset within the candidate page, e.g. an LBA ("Logical Block Address") offset, etc. For example, with reference to FIG. 6, for a first pass through the steps 506-510 in FIG. 5, e.g. traversing subset $S_0$ 604, for the hash value generated from the chunk beginning with data element $b_0$ at position 1, an offset of 0 bytes for the data element $b_0$ may be recorded.

In a step 512 of FIG. 5, a determination is made as to whether the last data element position within the current subset has been reached, e.g., whether k=K. That is, if K=8 and k=1 denotes the first position, then k=8 indicates that the last data element position has been reached within the current subset. If the last position within the subset has not been reached, then the position variable k is incremented by 1 in a step 514, and the method of FIG. 5 returns to step 506, and then performs steps 506-510 for the next data element position within the current subset. For example, with reference to FIG. 6, for subset $S_0$ 604, a second pass through the steps 506-510 (when k=2) may then i) calculate H2 608b for the four byte chunk of data elements $b_1$-$b_4$ corresponding to (e.g. beginning with) data element $b_1$, ii) determine that maxH[2]=H2 608b, and iii) determine and record a corresponding location maxlocH[2] equal to the offset of $b_1$, e.g. equal to an offset of 1 byte. For subsequent passes through the steps 506-508 for subsequent subsets of the candidate page (e.g. for subset $S_1$ 706), the value of maxH[k] for k=2 may be updated in response to the subsequently calculated value of H2 (e.g., in response to H2 609b being greater than H2 608b) for the future subsets, and the location maxlocH[2] may also be updated accordingly in step 510.

The steps 506-510 are repeated K times for each subset. For example, for an embodiment in which K=8, steps 506-510 produce hash values H1-H8 for each subset. Referring to FIG. 6, performing steps 506-510 for $S_0$ 604 produces H1 608a, H2 608b, H3 608c, H4 608d, H5 608e, H6 608f, H7 608g, and H8 608h. As $S_0$ 604 is the first subset of Candidate Page 702, the result of this first pass through steps 506-510 is maxH[1]=H1 608a, maxH[2]=H2 608b, maxH[3]=H3 608c, maxH[4]=H4 608d, maxH[5]=H5 608e, maxH[6]=H6 608f, maxH[7]=H7 608g and maxH[8]=H8 608h.

After steps 506-510 have been repeated K times, the disclosed technology determines in step 512 that the current position k is the last position within the current subset, and then step 512 is followed by step 516. In step 516, the disclosed technology determines whether the current subset is the last subset of Candidate Page 602; i.e., whether s=S−1. For example, if S=512 and s=0 denotes the first subset, then s=511 (i.e., S−1) indicates that the current subset is the last subset.

If it is determined in the step 516 that the current subset is not the last subset, then the subset variable is incremented by 1 in a step 518, and step 518 is followed by step 504, in which the data element position variable is re-initialized to 1, and the steps 506-510 are performed for the new current subset. For example, referring to FIG. 6, if s=1 and k=1, step 506 is then performed for the chunk starting with data element $b_8$ in subset $S_1$ 606, which produces H1 609a. In step 508, the maximum hash value calculated for the chunks beginning at position k=1 in any if the subsets processed thus far (e.g., subsets $S_0$ and $S_1$) is determined (e.g. maxH [1]=max(H 609a, maxH[1]), and the corresponding location (e.g. maxlocH[1]) may be updated in step 510 if necessary. Steps 506-510 are repeated K times for each subset (e.g. 8 times for K=8), in order to process the chunk starting at each position within the subset. For example, as also shown in FIG. 6, for the subset $S_1$ 606, performing steps 506-510 K (e.g. 8) times produces H1 609a, H2 609b, H3 609c, H4 609d, H5 609e, H6 609f, H7 609g, and H8 609h. After performing steps 506-510 eight times for subset $S_1$ 606, The values of maxH[x], and maxlocH[x] will depend on the relative values of H[x] calculated for the first two subsets $S_0$ 604 and $S_1$ 606.

After steps 506-510 have been repeated K times for s=1, at step 612 a determination is made that the current position k is the last data element position within the subset $S_1$ 606, and then at step 516 a determination is made as to whether the current subset is the last subset of Candidate Page 602. The loop defined by the steps 504-516 is performed S times; i.e., for each subset, until all subsets of the candidate page have been processed. In the example of FIG. 6, in which N=4096, S=512 and K=8, if it is determined in the step 516 that the current subset is the last subset, i.e., s=511, then the method shown in FIG. 5 ends for the current candidate page. After performing the method shown in FIG. 5 for all subsets in the current candidate page, two vectors have been generated: 1) a vector of maxH values, i.e. maxH[1:K], and 2) a corresponding vector of maxlocH values, i.e. maxlocH [1:K]. For example, if K=8, then maxH[1:8]=[maxH[1], maxH[2], maxH[3], maxH[4], maxH[5], maxH[6], maxH [7], maxH[8], and maxlocH[1:8]=maxlocH[1], maxlocH[2], maxlocH[3], maxlocH[4], maxlocH[5], maxlocH[6], maxlocH[7], and maxlocH[8]. These vectors may be used to create a representative portion of the candidate page, for example, using the method described below with reference to FIG. 7.

In some embodiments, some or all of the maximum hash values determined in step 508 of FIG. 5 (e.g. some limited number M of the K maximum hash values, where M<K) may be used as the corresponding set of multiple hash values generated for the candidate page, and compared to other sets of multiple hash values generated for other candidate pages in order to determine the level of similarity between candidate pages. Alternatively, in some other embodiments, the maximum hash values determined in step 508 of FIG. 5 may not be used directly as the one or more hash values generated for the candidate page for comparison with the hash values generated for other candidate pages. Instead, the locations of the data chunks that generated the maximum hash values determined in step 508 may be used to construct a representative data portion of the candidate page, and the resulting representative data portion may then be used to generate a single corresponding hash value for the candidate page, as further described below.

Figure 7:
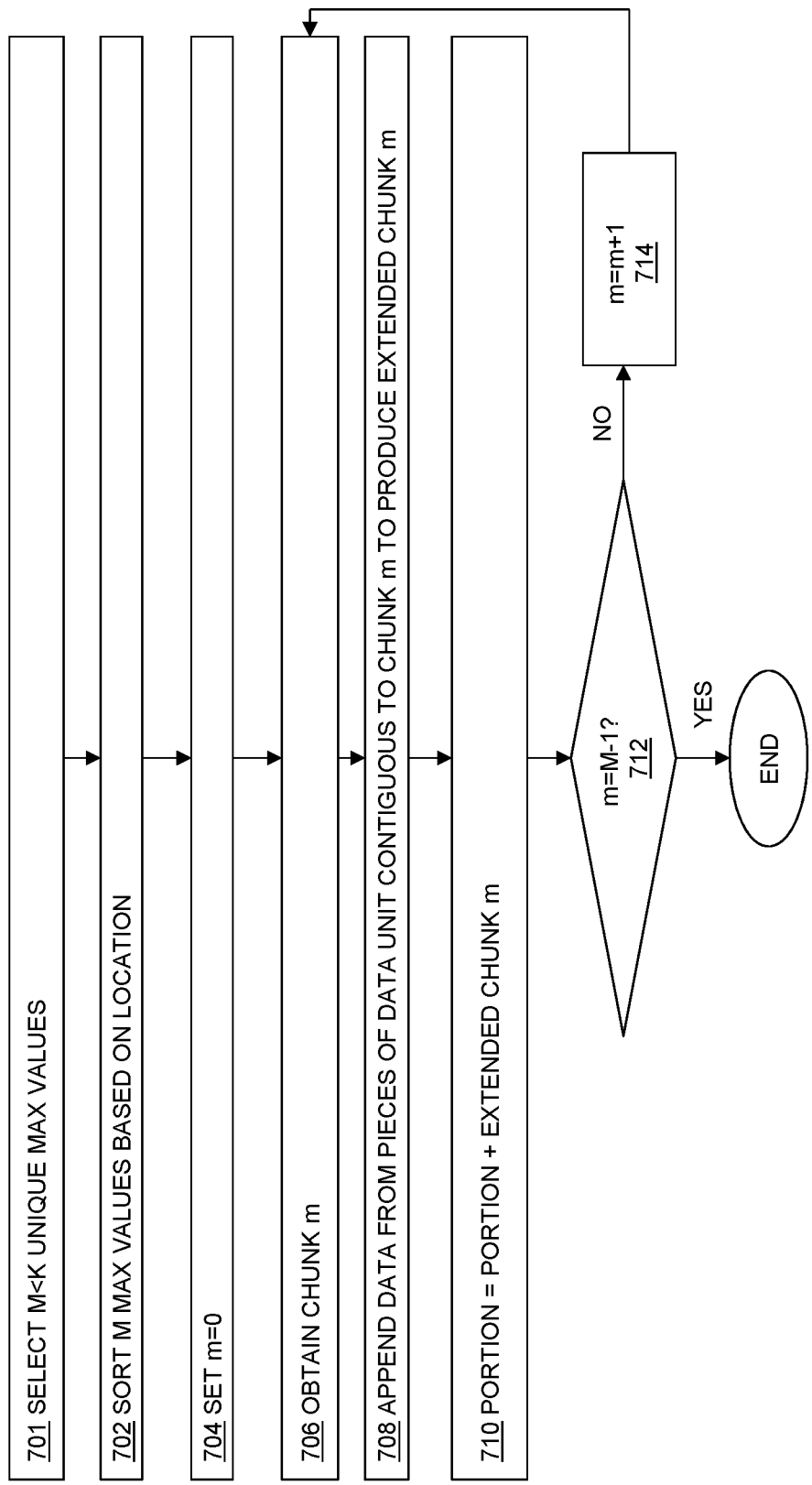
FIG. 7 is a flow chart showing an example of how some embodiments may create a representative portion of a candidate page to be hashed from chunks of the candidate page.

FIG. 7 is a flow chart illustrating an example of how some embodiments may create a representative portion of each candidate page from chunks of the candidate page, so that a single hash value corresponding to the candidate page can then be generated by applying a hash function to the representative portion of the candidate page. Alternatively, some embodiments may use a variation of the method shown in FIG. 7 to generate the representative portion of each candidate page, and such variations are intended to fall within the scope of the invention. The steps of FIG. 7 may, for example, be performed by the Hash Value Generation Logic 158 shown in FIG. 1.

In step 701, a predetermined number "M" of unique maximum values of the maxH[1:K] vector are selected, where M<K. For example, M may be the desired number of maximum hash values from which the representative portion is to be created, while K>M maximum hash values may have been generated from the candidate page in order to avoid using duplicate maximum hash values when creating the representative portion. The value of M may be selected to provide a desired degree of similarity between candidate pages that is necessary for the candidate pages to be deemed sufficiently similar; i.e., to reflect a desired degree of similarity between two candidate pages that is necessary for the two candidate pages to produce matching hash values from their respective representative portions. The larger the value of M that is selected, the greater the number of matching bits between candidate pages that are necessary to produce matching hash values from the representative portions of the candidate pages. Accordingly, larger values of M will generally result in fewer matching hash values, such that fewer candidate pages will be determined to be similar and as a result be combined for purposes of performing data compression, while smaller values of M will result in more matching hash values, such that more candidate pages will be determined to be similar and therefore combined for purposes of data compression. In some embodiments, M unique maximum hash values having the highest values are selected from the K maximum hash values determined from the candidate page.

In step 702, the M unique maximum hash values selected at step 701 may be sorted according to the locations within the candidate page of the chunks of data elements from which the unique maximum hash values were generated, producing a vector maxH[0:M−1] and a vector maxlocH[0:M−1].

In step 704, a vector position variable, e.g. "m", is initialized to 0.

In step 706, the chunk of data elements corresponding to the maximum value stored at vector position m within the maxH[0:M−1] vector is obtained—i.e., accessed from a memory location for the position m that is specified in the maxlocH[0:M−1] vector.

In step 708, for the chunk obtained at step 706, contiguous pieces (e.g. additional chunks) of data from immediately before and/or immediately after the chunk (e.g., neighboring bytes) may be concatenated to the beginning and end of the chunk, in order to produce an extended chunk. In some embodiments, the original chunk obtained at step 706 is 4 bytes in length, and the contiguous pieces from immediately before and immediately after the chunk are each 4 bytes in length, thus producing an extended chunk having a length of 12 bytes.

Adding contiguous pieces that were not involved in generating the maximum hash value may reduce the number of false positives when determining matches between hash values of representative portions of candidate pages. For example, in embodiments in which step 506 of FIG. 5 generates hash values of relatively small chunks of data (e.g., 4 byte chunks), it is possible that two candidate pages may generate the same maximum hash values, but not actually be sufficiently similar to be combined for compression, e.g. not similar to a desired level of similarity required to combine the candidate pages for purposes of data compression. Thus, to decrease the likelihood that representative portions generated for two candidate pages produce the same hash value when the candidate pages are not sufficiently similar, despite relatively small chunks producing the same maximum hash values, contiguous pieces may be added on either end of each chunk to produce the extended chunks. If two candidate pages are highly similar, the hash values produced from representative portions created from the extended chunks are still likely to be the same and accordingly match. However, if two candidate pages are not highly similar, it is less likely that the hash values produced from the representative portions created from the extended chunks will be the same.

In a step 710, the extended chunk produced in step 708 may be appended to the current representative portion. For example, when the first extended chunk is generated based on the chunk stored in memory at the location indicated by the contents of the vector element in the first position of maxlocH[ ], e.g. the element having a vector position of m=0, the representative portion may be initially set to that first extended chunk. Subsequently produced extended chunks may thereafter be appended thereto.

In a step 712, it may be determined whether the current position m is the last position in maxH[0:M−1]. If not, the vector position variable m is incremented, and step 712 is followed by step 706, in order to repeat the steps 706-710 for the next position in maxH[0:M−1]. Otherwise, if it is determined at step 712 that the current position m is the last position in maxH[0:M−1], the representative portion is complete for the current candidate page, and the method shown in FIG. 7 ends.

In some embodiments, the chunks of data may be obtained from the candidate page (and contiguous pieces added thereto) in any order, and then arranged in the representative portion in an order according to their previous relative locations (e.g., LBA, offset, etc.) within the candidate page from which they were obtained. In some embodiments, rather than being arranged accordingly to relative locations within the candidate page, the chunks of data (and contiguous pieces added thereto) may alternatively be arranged according to relative value (e.g., from highest value to lowest value or vice versa) in order to form the representative portion, or based on some other ordering.

After completion of the steps shown in FIG. 7, the representative portion has been created for the current candidate page. If M=5 and the extended chunks are each 12 bytes in length, the representative portion created for each candidate page may accordingly be 60 bytes in length. A corresponding individual hash value may be generated for each candidate page by application of a hash function to the representative portion generated from the candidate page. In embodiments in which each candidate page is 4096 bytes in length, rather than generating a hash value for 4096 bytes, the hash value may advantageously be generated for a representative portion of the candidate that is significantly smaller, only 60 bytes in length.

Instead of generating separate hash values for every data element (e.g., byte) of a candidate page, some embodiments may not generate a hash value for individual data elements, but rather for chunks of data elements, although the present invention is not so limited. In some embodiments, hash values may be generated for individual data elements. Additionally, instead of generating multiple hash values for every piece of data for which a hash value is generated, some embodiments may not generate multiple hash values for every piece of data for which a hash value is generated, but rather generate only a single hash value for each chunk, although the invention is not so limited. In some embodiments, multiple hash values may be generated for each chunk. Generating only a single hash value for each chunk may reduce computational overhead, conserving computation resources.

It should be appreciated that various parameters of the system and the method described herein may be modified to achieve specific desired data compression and/or system performance properties, including, but not limited to, K, S, M, N, size of data elements, and the number of data elements in each chunk.

Figure 8:
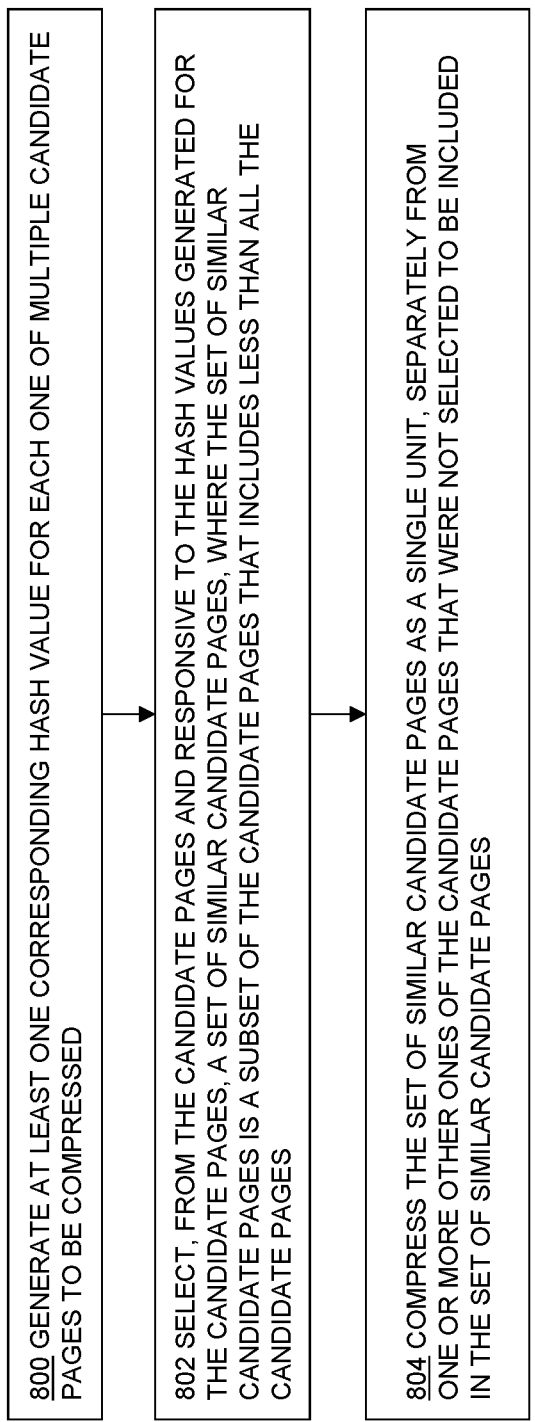
FIG. 8 is a flow chart showing an example of steps performed during operation of some embodiments.

FIG. 8 is a flow chart showing an example of steps performed during operation of some embodiments.

At step 800, at least one corresponding hash value is generated for each one of multiple candidate pages to be compressed.

At step 802, a set of similar candidate pages are selected from the candidate pages responsive to the hash values generated for the candidate pages, where the set of similar candidate pages is a subset of the candidate pages that includes less than all the candidate pages.

At step 804, the set of similar candidate pages is compressed as a single unit, separately from one or more other ones of the candidate pages that were not selected to be included in the set of similar candidate pages.

As will be appreciated by one skilled in the art, aspects of the technologies disclosed herein may be embodied as a system, method or computer program product. Accordingly, each specific aspect of the present disclosure may be embodied using hardware, software (including firmware, resident software, micro-code, etc.) or a combination of software and hardware. Furthermore, aspects of the technologies disclosed herein may take the form of a computer program product embodied in one or more non-transitory computer readable storage medium(s) having computer readable program code stored thereon for causing a processor and/or computer system to carry out those aspects of the present disclosure.

Any combination of one or more computer readable storage medium(s) may be utilized. The computer readable storage medium may be, for example, but not limited to, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any non-transitory tangible medium that can contain, or store a program for use by or in connection with an instruction execution system, apparatus, or device.

The figures include block diagram and flowchart illustrations of methods, apparatus(s) and computer program products according to one or more embodiments of the invention. It will be understood that each block in such figures, and combinations of these blocks, can be implemented by computer program instructions. These computer program instructions may be executed on processing circuitry to form specialized hardware. These computer program instructions may further be loaded onto programmable data processing apparatus to produce a machine, such that the instructions which execute on the programmable data processing apparatus create means for implementing the functions specified in the block or blocks. These computer program instructions may also be stored in a computer-readable memory that can direct a programmable data processing apparatus to function in a particular manner, such that the instructions stored in the computer-readable memory produce an article of manufacture including instruction means which implement the function specified in the block or blocks. The computer program instructions may also be loaded onto a programmable data processing apparatus to cause a series of operational steps to be performed on the programmable apparatus to produce a computer implemented process such that the instructions which execute on the programmable apparatus provide steps for implementing the functions specified in the block or blocks.

Those skilled in the art should also readily appreciate that programs defining the functions of the present invention can be delivered to a computer in many forms; including, but not limited to: (a) information permanently stored on non-writable storage media (e.g. read only memory devices within a computer such as ROM or CD-ROM disks readable by a computer I/O attachment); or (b) information alterably stored on writable storage media (e.g. floppy disks and hard drives).

While the invention is described through the above exemplary embodiments, it will be understood by those of ordinary skill in the art that modification to and variation of the illustrated embodiments may be made without departing from the inventive concepts herein disclosed.

What is claimed is:

1. A method comprising:
    generating a corresponding set of hash values for each one of a plurality of candidate pages to be compressed;
    selecting, from the candidate pages and responsive to the sets of hash values generated for the candidate pages, a set of similar candidate pages, wherein the set of similar candidate pages comprises a subset of the candidate pages that includes less than all the candidate pages, at least in part by:
        comparing the sets of hash values corresponding to the candidate pages at least in part by generating, for each pair of candidate pages, a similarity index using the sets of hash values corresponding to that pair of candidate pages,
        identifying a set of candidate pages within which each candidate page has a corresponding set of hash values with at least a minimum similarity index value with respect to the corresponding set of hash values of each other candidate page, and
        selecting the set of candidate pages with corresponding sets of hash values having at least the minimum threshold level of similarity to each other as the set of similar candidate pages; and
    compressing the set of similar candidate pages as a single unit, and separately from one or more other ones of the candidate pages that were not selected to be included in the set of similar candidate pages.

2. The method of claim 1, wherein generating the similarity index for each pair of candidate pages comprises generating, for each pair of candidate pages, a Jaccard similarity index using the corresponding sets of hash values for the pair.

3. The method of claim 1, wherein generating the corresponding set of hash values for each one of the candidate pages comprises selecting a corresponding hash value for each one of a plurality of data element positions across a plurality of data subsets within the candidate page.

4. The method of claim 3, wherein selecting the corresponding hash value for each one of the plurality of data element positions across the plurality of data subsets within the candidate page comprises selecting a maximum corresponding hash value for each one of the plurality of data element positions across the plurality of data subsets.

5. The method of claim 3, further comprising selecting, as the set of hash values corresponding to each candidate page, fewer than the total number of corresponding hash values selected for the data element positions across the plurality of data subsets within the candidate page.

6. The method of claim 1, wherein compressing the set of similar candidate pages as a single unit separately from the one or more other ones of the candidate pages that were not selected to be included in the set of similar candidate pages further comprises generating a compression dictionary for the set of similar candidate pages that is separate and independent from one or more compression dictionaries generated for the other ones of the candidate pages that were not selected to be included in the set of similar candidate pages.

7. A data storage system comprising:
    at least one storage processor including processing circuitry and a memory;
    a plurality of non-volatile data storage drives communicably coupled to the storage processor; and
    wherein the memory has program code stored thereon, wherein the program code, when executed by the processing circuitry, causes the processing circuitry to:
        generate a corresponding set of hash value for each one of a plurality of candidate pages to be compressed;
        select, from the candidate pages and responsive to the sets of hash values generated for the candidate pages, a set of similar candidate pages, wherein the set of similar candidate pages comprises a subset of the candidate pages that includes less than all the candidate pages, at least in part by:
            comparing the sets of hash values corresponding to the candidate pages at least in part by generating, for each pair of candidate pages, a similarity index using the sets of hash values corresponding to that pair of candidate pages,
            identifying a set of candidate pages within which each candidate page has a corresponding set of hash values with at least a minimum similarity index value with respect to the corresponding set of hash values of each other candidate page, and
            selecting the set of candidate pages with corresponding sets of hash values having at least the minimum threshold level of similarity to each other as the set of similar candidate pages; and
        compress the set of similar candidate pages as a single unit, and separately from one or more other ones of the candidate pages that were not selected to be included in the set of similar candidate pages.

8. The data storage system of claim 7, wherein generating the similarity index for each pair of candidate pages comprises generating, for each pair of candidate pages, a Jaccard similarity index using the corresponding sets of hash values for the pair.

9. The data storage system of claim 7, wherein generating the corresponding set of hash values for each one of the candidate pages comprises selecting a corresponding hash value for each one of a plurality of data element positions across a plurality of data subsets within the candidate page.

10. The data storage system of claim 9, wherein selecting the corresponding hash value for each one of the plurality of data element positions across the plurality of data subsets within the candidate page comprises selecting a maximum corresponding hash value for each one of the plurality of data element positions across the plurality of data subsets.

11. The data storage system of claim 9, wherein the program code, when executed by the processing circuitry, further causes the processing circuitry to select, as the set of hash values corresponding to each candidate page, fewer than the total number of corresponding hash values selected for the data element positions across the plurality of data subsets within the candidate page.

12. The data storage system of claim 7, wherein the set of similar candidate pages is compressed as a single unit separately from the one or more other ones of the candidate pages that were not selected to be included in the set of similar candidate pages further at least part by generation of a compression dictionary for the set of similar candidate pages that is separate and independent from one or more compression dictionaries generated for the other ones of the candidate pages that were not selected to be included in the set of similar candidate pages.

13. A computer program product including a non-transitory computer readable medium having instructions stored thereon, wherein the instructions, when executed on processing circuitry, cause the processing circuitry to perform steps including:

generating a corresponding set of hash value for each one of a plurality of candidate pages to be compressed;

selecting, from the candidate pages and responsive to the sets of hash values generated for the candidate pages, a set of similar candidate pages, wherein the set of similar candidate pages comprises a subset of the candidate pages that includes less than all the candidate pages, at least in part by:

comparing the sets of hash values corresponding to the candidate pages at least in part by generating, for each pair of candidate pages, a similarity index using the sets of hash values corresponding to that pair of candidate pages, identifying a set of candidate pages within which each candidate page has a corresponding set of hash values with at least a minimum similarity index value with respect to the corresponding set of hash values of each other candidate page, and selecting the set of candidate pages with corresponding sets of hash values having at least the minimum threshold level of similarity to each other as the set of similar candidate pages; and compressing the set of similar candidate pages as a single unit, and separately from one or more other ones of the candidate pages that were not selected to be included in the set of similar candidate pages.

* * * * *